United States Patent
Choi

(10) Patent No.: US 7,968,467 B2
(45) Date of Patent: Jun. 28, 2011

(54) METHOD FOR FORMING PATTERNS IN SEMICONDUCTOR MEMORY DEVICE

(75) Inventor: Jae Seung Choi, Icheon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 636 days.

(21) Appl. No.: 12/119,875

(22) Filed: May 13, 2008

(65) Prior Publication Data

US 2009/0111270 A1   Apr. 30, 2009

(30) Foreign Application Priority Data

Oct. 26, 2007   (KR) .................. 10-2007-0108233

(51) Int. Cl.
*H01L 21/302* (2006.01)
*C03C 15/00* (2006.01)

(52) U.S. Cl. ........ 438/696; 438/689; 438/700; 438/737; 438/738; 216/13; 216/41; 216/58

(58) Field of Classification Search .................. 438/689, 438/696, 700, 737, 738; 216/13, 41, 58
See application file for complete search history.

(56) References Cited

U.S. PATENT DOCUMENTS

| 6,329,124 | B1 | 12/2001 | Rangarajan et al. .......... 430/313 |
| 7,300,837 | B2 | 11/2007 | Chen et al. |
| 2003/0230234 | A1* | 12/2003 | Nam et al. ...................... 117/97 |
| 2008/0085612 | A1* | 4/2008 | Smythe et al. ................ 438/787 |
| 2008/0261156 | A1* | 10/2008 | Ryou et al. ..................... 430/312 |

FOREIGN PATENT DOCUMENTS

| KR | 10-0261167 | 4/2000 |
| KR | 10-2002-0024415 | 3/2002 |

* cited by examiner

*Primary Examiner* — Shamim Ahmed
(74) *Attorney, Agent, or Firm* — Marshall, Gerstein & Borun LLP

(57) ABSTRACT

A method for forming patterns in a semiconductor memory device, wherein first spacers arranged at a first spacing and second spacers arranged at a second spacing are formed on a target layer which is formed on a semiconductor substrate. A mask pattern is formed to cover a portion of the target layer defined by the two adjacent second spacers. At least two first patterns and at least one second pattern is formed by patterning the target layer using the first spacers, the second spacers and the mask pattern as an etch mask. Here, the second pattern is wider than the first pattern.

17 Claims, 6 Drawing Sheets

METHOD FOR FORMING PATTERNS IN SEMICONDUCTOR MEMORY DEVICE

CROSS-REFERENCE TO RELATED APPLICATION

Priority to Korean patent application number 10-2007-0108233, filed on Oct. 26, 2007, the disclosure of which is incorporated by reference in its entirety, is claimed.

BACKGROUND OF THE INVENTION

The invention relates to a method for forming a semiconductor and, more particularly, to a method for forming patterns in a semiconductor memory device using a spacer.

As semiconductor devices have become more highly integrated, the semiconductor devices require resolution higher than that of the photolithography apparatus used to make patterns. For example, whereas the minimum size resolvable through a single exposure using the photolithography apparatus is 45 nm, a semiconductor device may require resolution smaller than 40 nm. Therefore, in order to overcome the limitation of the photolithography apparatus in forming ultra-fine patterns, a variety of methods have been suggested. One of them is a method for forming patterns using a spacer.

The method for forming patterns using a spacer includes forming a material layer pattern of a predetermined size on an etch target layer, forming a spacer around the material layer pattern, and etching the etch target layer using the spacer as an etch mask. As such, it is possible to form a pattern which is about as fine as the thickness of the spacer.

Accordingly, this method for forming patterns using a spacer is widely used to form patterns in highly integrated semiconductor memory devices.

However, since the spacers are formed to the same thickness independent of location, it is difficult to form repeated fine patterns such as lines/spaces and patterns greater than a predetermined size simultaneously with a single mask. Accordingly, a process for forming repeated fine patterns and a process for forming a pattern greater than a predetermined size should be performed separately with different masks. Therefore misalignment between the masks is likely to occur. In other words, when the patterns of different sizes are formed by the method for forming patterns using a spacer, misalignment may occur due to the different masks, which may cause partially different pattern spacings.

Such partially different pattern spacing may cause serious problems in a device such as a flash memory device where the spacing between the patterns has a significant effect on device characteristics. Spacing between a source select transistor and its adjacent word line, and spacing between a drain select transistor and its adjacent word line has the most significant effect on characteristics of the flash memory device. If these spacings are not uniform and do not satisfy critical dimensions (CDs), serious problems such as a program disturbance may occur in an operation of a device, and then the device cannot operate normally.

FIG. 1 illustrates a cross-sectional view of a semiconductor memory device with misaligned patterns formed by a typical method for forming patterns using a spacer.

Referring to FIG. 1, a spacing between a gate 110 of a drain select transistor and a gate 130 of a cell transistor adjacent to the drain select transistor, and a spacing between a gate 120 of a drain select transistor and a gate 132 of a cell transistor adjacent tot the drain select transistor in adjacent block do not match each other. In this case, a serious problem may occur during the operation of the device, and thus reliability of the device may be reduced. Such problems also occur frequently in other memory devices where spacing between patterns has significant effect on the device characteristics.

SUMMARY OF THE INVENTION

Embodiments of the invention are directed to a method for forming patterns in a semiconductor memory device such that spacings between patterns are uniform when repeating line patterns and a pattern greater than a predetermined size exist together.

In one embodiment, a method for forming patterns in a semiconductor memory device comprises: forming first spacers arranged at a first spacing and second spacers arranged at a second spacing on a target layer formed on a semiconductor substrate; forming a mask pattern covering a portion of the target layer defined by adjacent second spacers; and forming at least two first patterns and at least one second pattern by patterning the target layer using the first spacers, the second spacers, and the mask pattern as an etch mask, wherein the second pattern is wider than the first pattern.

The second spacing is preferably smaller than a width of the second pattern by twice the thickness of the second spacer.

Forming the first spacers and the second spacers preferably comprises: forming a sacrificial layer on the target layer; forming a first sacrificial layer pattern and a second sacrificial layer pattern by etching the sacrificial layer; forming the first spacers on respective sidewalls of the first sacrificial layer pattern and forming the second spacers on respective sidewalls of the second sacrificial layer pattern; and removing the first and second sacrificial layer patterns.

The first sacrificial layer pattern preferably has a pitch as long as a double pitch of the first pattern.

Forming the mask pattern preferably comprises: applying a photoresist on the semiconductor substrate; and patterning the photoresist with controlling a critical dimension thereof such that the portion of the target layer defined by the adjacent second spacers is not exposed.

In another embodiment, a method for forming patterns in a semiconductor memory device comprises: forming a target layer on the semiconductor substrate; forming a first sacrificial layer pattern and a second sacrificial layer pattern on the target layer; forming first spacers on respective sidewalls of the first sacrificial layer pattern, and forming second spacers on respective sidewalls of the second sacrificial layer pattern; removing the first and second sacrificial layer patterns; forming a mask pattern covering a portion of the target layer defined by the adjacent second spacers; removing unnecessary spacers among the first and second spacers; etching the target layers using the first spacers, the second spacers, and the mask pattern as an etch mask; and forming at least two first patterns and at least one second pattern by removing the first spacers, the second spacers, and the mask pattern, wherein the second pattern is wider than the first pattern.

The target layer is preferably a gate conductive layer of a transistor or a bit line conductive layer.

The first sacrificial layer pattern preferably has a pitch as large as a double pitch of the first pattern. The second sacrificial layer pattern preferably has a width smaller than a width of the second pattern by twice a thickness of the second spacer.

The method preferably further comprises forming a hard mask of a single layer or multiple layers on the target layer, prior to forming the first and second sacrificial layer patterns.

The method preferably further comprises forming an anti-reflection layer on the first and second sacrificial layer patterns.

In still another embodiment, a method for forming a gate in a flash memory device comprises: forming a first sacrificial layer pattern and a second sacrificial layer pattern on a gate conductive layer formed on a semiconductor substrate; forming first spacers on respective sidewalls of the first sacrificial layer pattern and second spacers on respective sidewalls of the second sacrificial layer pattern; removing the first and second sacrificial layer patterns; forming a mask pattern covering a portion of the gate conductive layer defined by the adjacent second spacers; and forming a gate of a cell transistor and a gate of a select transistor by patterning the gate conductive layer using the first spacers, the second spacers and the mask pattern as an etch mask.

The first sacrificial layer pattern preferably has a pitch as long as a double pitch of the gate pattern of the cell transistor.

The second sacrificial layer pattern preferably has a width smaller than a width of the gate of the select transistor by twice a thickness of the second spacer.

The method preferably further comprises forming a hard mask of a single layer or multiple layers on the gate conductive layer, prior to the forming of the first and second sacrificial layer patterns.

DESCRIPTION OF SPECIFIC EMBODIMENTS

Hereinafter, a method for forming patterns in a semiconductor memory device in accordance with the invention is described in detail with reference to the accompanying drawings.

A method for forming patterns in a semiconductor memory device using a spacer may be effectively applied to forming patterns in a shape of repeating fine lines. However, forming a pattern having greater than a predetermined size requires an additional mask other than the mask for forming the repeating fine lines because it is difficult to form the lines simultaneously with a single mask. Especially, in a flash memory device, a memory cell transistor with repeating fine line patterns and a select transistor with patterns having greater than a predetermined size should be formed separately with different masks. While performing such a photolithography process using different masks, misalignment may occur, which may cause serious failure in operation of the flash memory device.

To resolve this problem, according to an embodiment of the invention, a mask pattern for forming a second pattern greater than a predetermined size is formed during a first patterning process for forming a first pattern having a shape of repeating fine lines. In addition, while forming a spacer for the first pattern, a spacer for the second pattern is also formed. As such, the spacer for the second pattern may secure misalignment margin in a patterning process for forming the second pattern, which may prevent malfunction of the device caused by the lack of uniformity of the pattern spacings.

FIGS. 2A to 2E illustrate a method for forming patterns in a semiconductor memory device according to one embodiment of the invention. FIGS. 3A to 3E further illustrate the method of FIGS. 2A to 2E.

Figure 1:
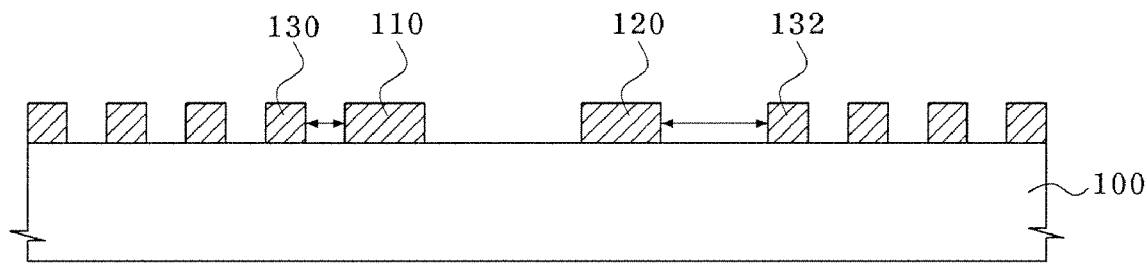
FIG. 1 illustrates a cross-sectional view of a semiconductor memory device with misaligned patterns formed by a typical method for forming patterns using a spacer.
Figure 2A:
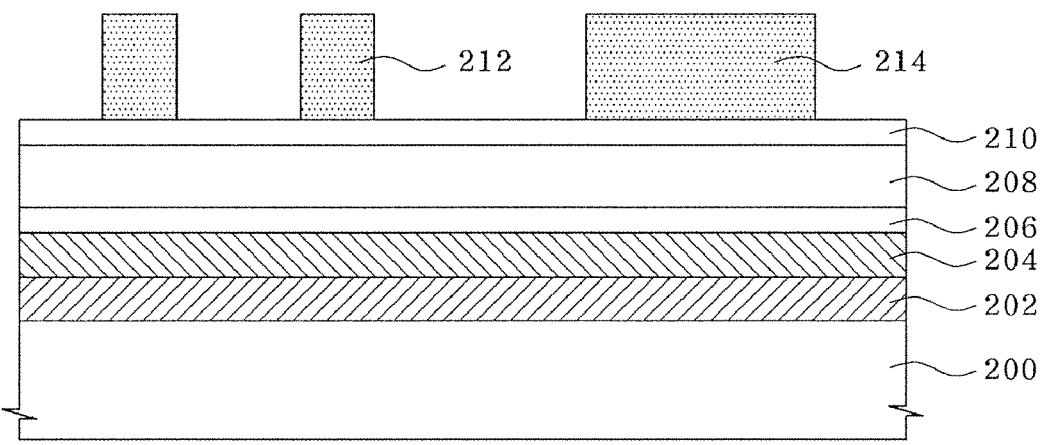
FIGS. 2A to 2E illustrate a method for forming patterns in a semiconductor memory device according to one embodiment of the present invention.
Figure 3A:
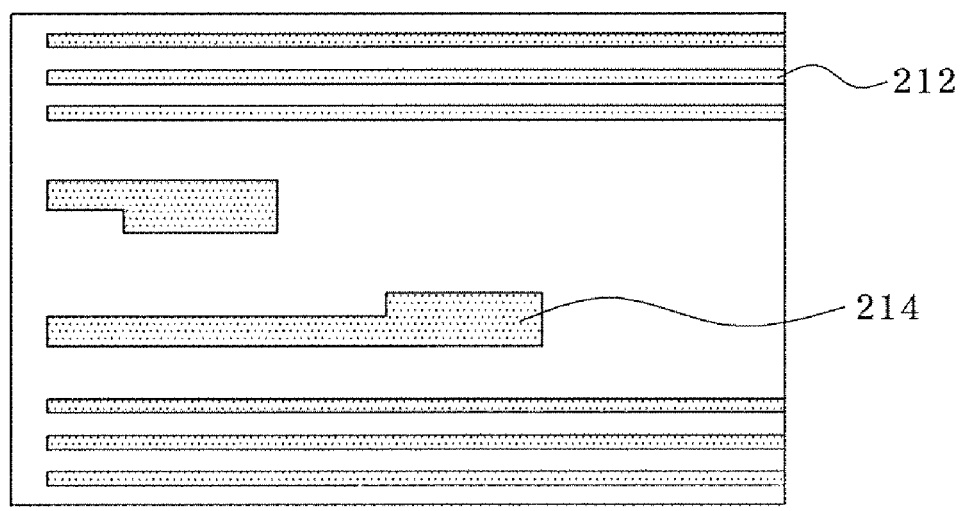
FIGS. 3A to 3E further illustrate the method of FIGS. 2A to 2E.

Referring to FIGS. 2A and 3A, etch target layers 202 and 204 are formed on a semiconductor substrate 200. The etch target layer may be a single layer or multiple layers in a layered structure.

In a memory device, the etch target layer 202 is typically a gate conductive layer of a transistor formed of, for example, polysilicon. Also, the etch target layer 204 is typically a low resistance layer formed of, for example, metal silicide for reducing resistance of a gate.

In a flash memory device, the etch target layer 202 may be a control gate conductive layer of a memory cell transistor and a gate conductive layer of a select transistor. In addition, an interlayer insulation layer may be disposed below the etch target layer, and a tunnel oxide layer of the cell transistor and a gate insulation layer of the select transistor may be disposed below the interlayer insulation layer.

Then, a hard mask 206 is formed on the etch target layer 204, and a first material layer 208 and an anti-reflection layer 210 are sequentially formed on the hard mask 206.

The hard mask 206 serves to protect the etch target layers 202 and 204 during an etching process for patterning the etch target layers 202 and 204. Accordingly, the hard mask 206 may be formed of a material having an etch selectivity with respect to the etch target layer in a process for etching the etch target layer. For example, when the etch target layer is formed of a polysilicon layer, the hard mask 206 is preferably formed of a nitride or an oxide. The hard mask 206 may be multiple layers in a layered structure.

The first material layer 208 is typically formed of an oxide, for example. The anti-reflection layer 210 serves to protect reflection of light in a photo-lithography process for patterning the etch target layer. The anti-reflection layer 210 is typically formed of silicon oxynitride (SiON), for example.

Thereafter, photoresist patterns 212 and 214 are formed on the anti-reflection layer 210 using a first mask. The photoresist patterns include a first photoresist pattern 212 for forming a first pattern having a shape of fine lines/spaces, and a second photoresist 214 for forming a second pattern greater than a predetermined size. In a flash memory device, the first photoresist pattern 212 may be used to form a gate of a memory cell transistor, and the second photoresist pattern 214 may be used to form a gate of a select transistor.

The first and second photoresist patterns 212 and 214 serve as a mask for patterning the first material layer 208 in a subsequent process. In a subsequent process, spacers are formed on either sidewall of the first material layer patterned by the first photoresist pattern 212, and finally, a first pattern in a line shape is formed using the spacer as a mask. As a result, a width of the first photoresist pattern 212 becomes a spacing between the adjacent first patterns, and the first photoresist pattern 212 is formed on anywhere between the adjacent first patterns. The first photoresist pattern 212 has a pitch as large as a double pitch of the first patterns. In other words, a spacing between the first photoresist patterns 212 corresponds to a spacing between two adjacent spaces. Here, the space refers to a region between the two adjacent first patterns.

Spacers are also formed on either sidewall of the first material layer 208 that is patterned by the second photoresist pattern 214. Then, a third photoresist pattern is formed between the spacers. The third photoresist pattern is used as a mask together with the spacers to form a second pattern. Accordingly, the second photoresist pattern 214 has a width smaller than a target width of the second pattern. For example, when a target width of the second pattern is 100 nm and a thickness of the spacer is 20 nm, the second photoresist pattern 214 may have a width of at least 60 nm.

Figure 2B:
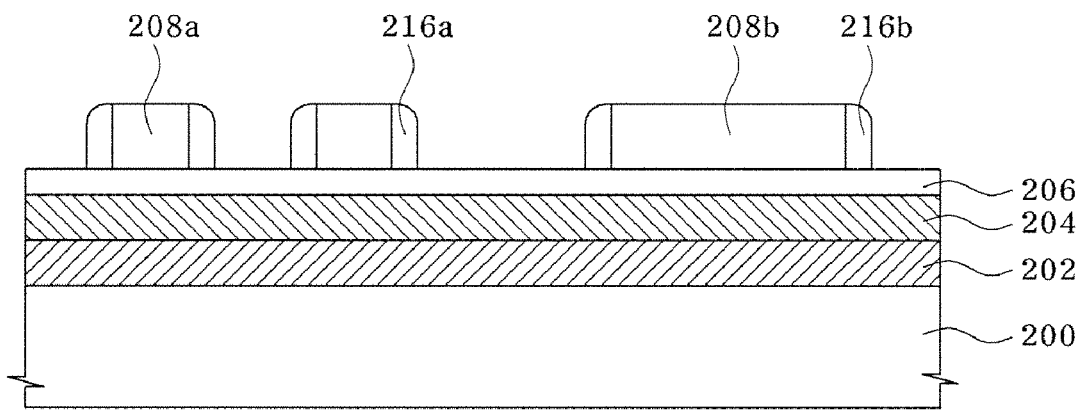
Figure 3B:
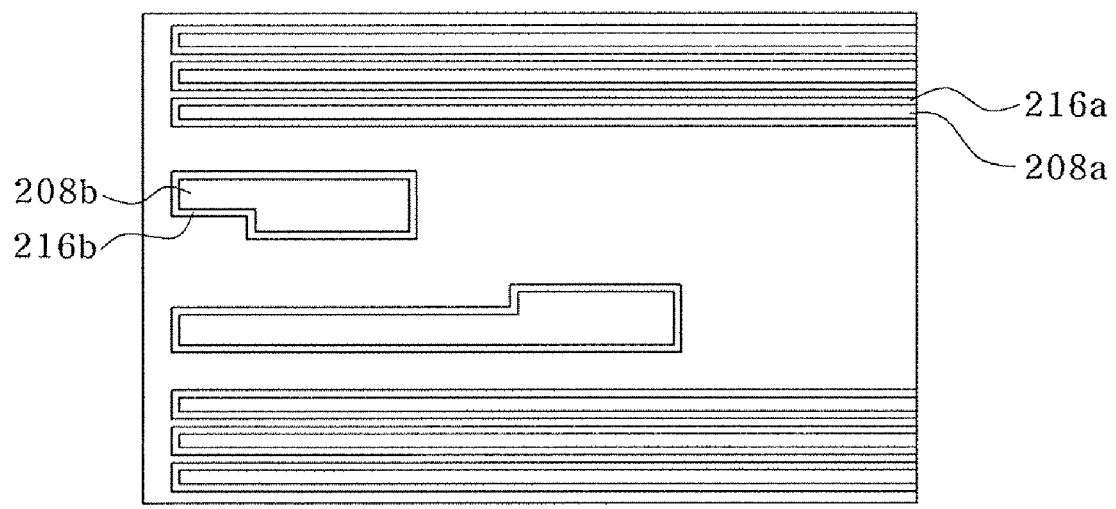

Referring to FIGS. 2B and 3B, the anti-reflection layer 210 in FIG. 2A and the first material are etched using the first and second photoresist patterns as etch masks, and then, the first and second photoresist patterns and the anti-reflection layer are removed. Material for the spacer, such as polysilicon, for example, is deposited on the entire surface of the semiconductor substrate on which the first material layer patterns 208a and 208b are formed. The deposited polysilicon layer is etched back to form spacers 216a and 216b on the sidewalls of the first material layer patterns 208a and 208b.

Preferably, the spacers 216a and 216b are formed of a material having relatively high etch selectivity compared to the first material patterns 208a and 208b and the hard mask 206. For example, when the first material layer patterns 208a and 208b are formed of an oxide and the hard mask 206 is formed of a nitride, the spacers 216a and 216b may be formed of a polysilicon. In addition, since a width of the first pattern is determined by a thickness of the spacer 216a, the thickness of the spacer 216a should be appropriately controlled to secure a desired width of the first pattern.

Figure 2C:
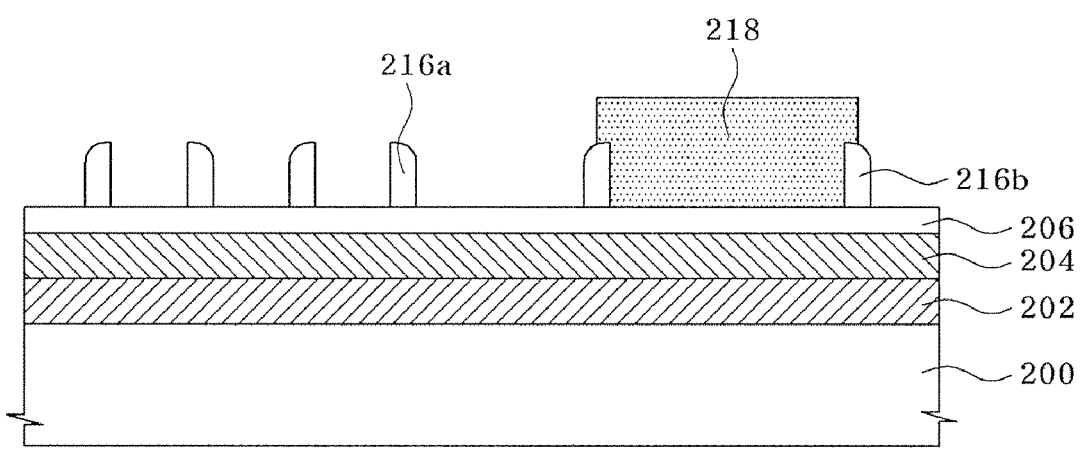
Figure 3C:
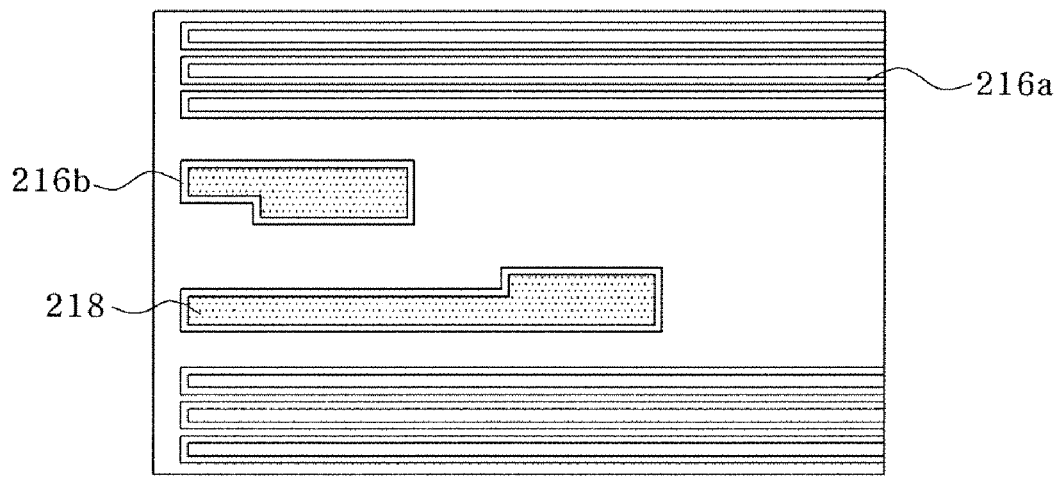

Referring to FIGS. 2C and 3C, the first material layer pattern between the spacers 216a and 216b is removed so that only the spacers 216a and 216b remain. Then, a third photoresist pattern 218 covers a portion of the hard mask 206 exposed between the adjacent spacers 216b, i.e., a portion of the hard mask 206 corresponding to the region where the second pattern is to be formed. The third photoresist pattern 218 and the spacers 216b serve as a mask in a subsequent process for patterning the etch target layers 202 and 204. Since the third photoresist pattern 218 has only to cover a surface of the hard mask 206 between the adjacent spacers 216b, the third photoresist pattern 218 may cover much of the spacers 216b. Therefore, an alignment margin twice as large as the thicknesses of the spacers 216b can be secured.

Especially in flash memory devices where uniformity of spacings between patterns has a significant effect on an operation of the devices, the memory devices made according to the invention can become less sensitive to misalignment. This is because of an alignment margin larger than (e.g., twice as large) the thicknesses of the spacers 216b between the first mask for patterning a gate of a cell transistor and the second mask for patterning a gate of a select transistor.

Figure 2D:
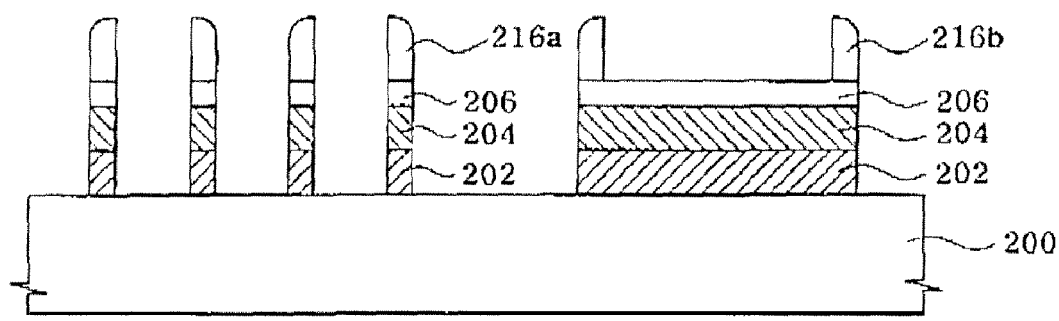
Figure 3D:
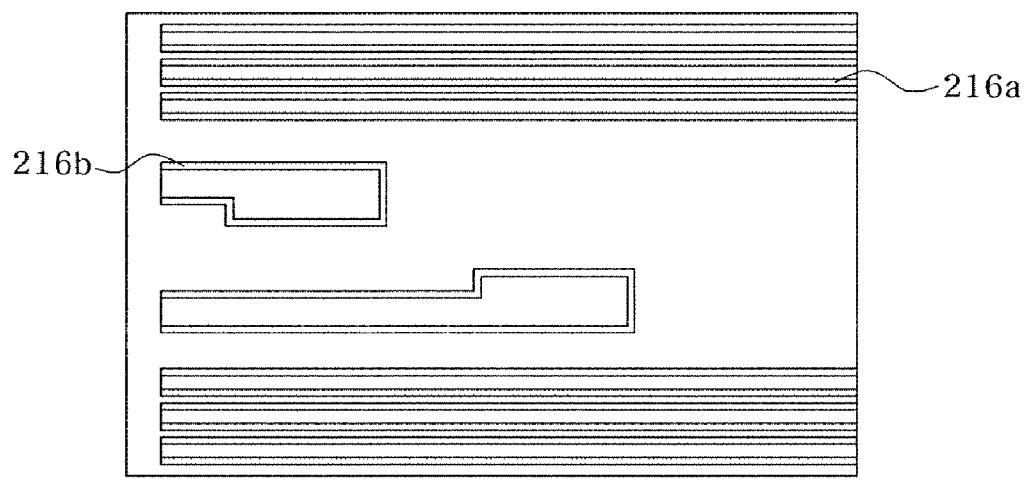

Referring to FIGS. 2D and 3D, the hard mask 206 is etched using the spacers 216a and 216b and the third photoresist pattern 218 in FIG. 2C as an etch mask, and then the third photoresist pattern is removed. Thereafter, the etch target layers 202 and 204 are etched and patterned using the spacers 216a and 216b and the hard mask 206 as an etch mask. It is also possible that the hard mask 206 is etched, and then the etch target layers 202 and 204 are etched under the presence of the third photoresist pattern. After that, unnecessary portions of the spacers 216a and 216b are removed using a third mask.

Figure 2E:
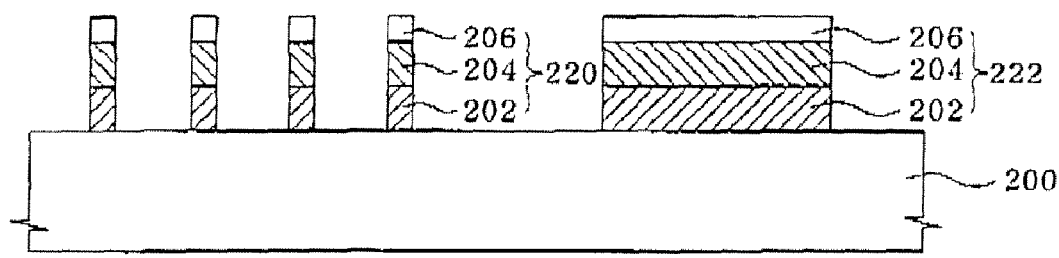
Figure 3E:
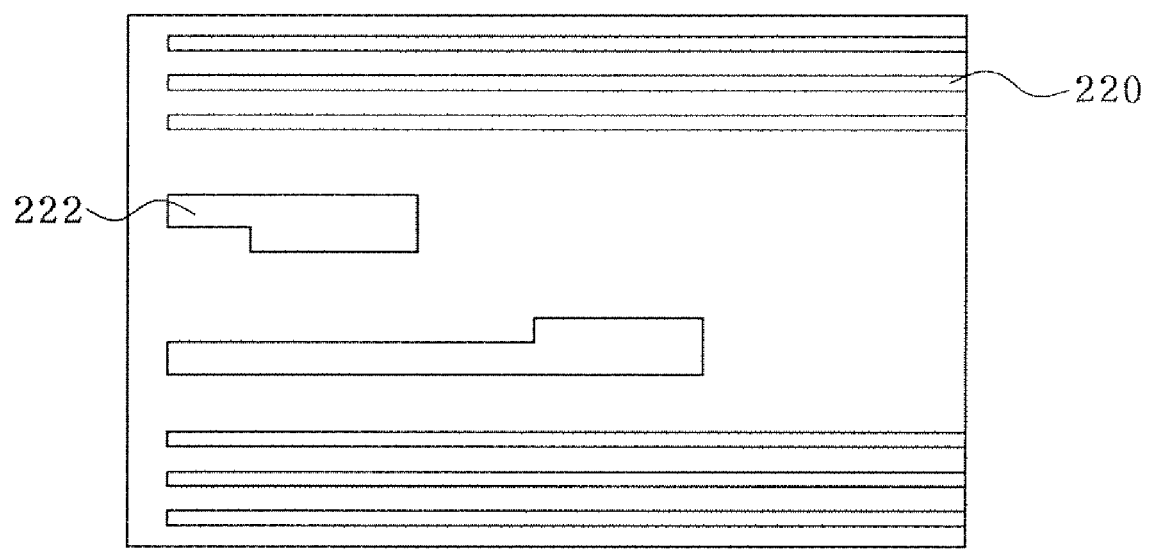

Referring to FIGS. 2E and 3E, all the spacers 216a and 216b in FIG. 2D are removed from the first and second pattern regions. As a result, a first pattern 220 and a second pattern 222 are formed with desired widths and a desired spacing therebetween. The first pattern 220 has a shape of repeating lines, and the second pattern 222 has a width greater than that of the first pattern 220.

Embodiments of the invention can be applied to forming a pattern having a shape of repeating lines and a pattern greater than a predetermined size. To this end, mask patterns for the two patterns may be formed simultaneously in a first photolithography process. In addition, spacers for the two patterns are also formed simultaneously in the subsequent process. Thereafter, a second photolithography process is performed to form an etch mask pattern in a spacer for forming the pattern greater than the predetermined size. Then, even if misalignment is caused in the patterns during the second photolithography process, the patterns have a margin as thick as the thickness of the spacer. Consequently, operation margin and uniform pattern spacing can be secured, and thus reliability of the device can be improved.

While the invention has been described with respect to the specific embodiments, various changes and modifications may be made without departing from the spirit and scope of the invention as defined in the following claims.

What is claimed is:

1. A method for forming patterns in a semiconductor memory device, the method comprising:
    forming first spacers arranged at a first spacing and second spacers arranged at a second spacing on a target layer formed on a semiconductor substrate;
    forming a mask pattern covering a portion of the target layer defined by the adjacent second spacers; and
    forming at least two first patterns and at least one second pattern by patterning the target layer using the first spacers, the second spacers, and the mask pattern as an etch mask,
    wherein the second pattern is wider than the first pattern.

2. The method of claim 1, wherein the second spacing is smaller than a width of the second pattern by twice a thickness of the second spacer.

3. The method of claim 1, wherein forming the first spacers and the second spacers comprises:
    forming a sacrificial layer on the target layer;
    forming a first sacrificial layer pattern and a second sacrificial layer pattern by etching the sacrificial layer;
    forming the first spacers on respective sidewalls of the first sacrificial layer pattern and the second spacers on respective sidewalls of the second sacrificial layer pattern; and
    removing the first and second sacrificial layer patterns.

4. The method of claim 3, wherein the first sacrificial layer pattern has a pitch as long as a double pitch of the first pattern.

5. The method of claim 3, wherein the sacrificial layer comprises a material having higher etch selectivity than the target layer.

6. The method of claim 5, wherein the target layer comprises a polysilicon film or a stacked structure of a polysilicon film and a metal silicide film, and
    the sacrificial layer comprises an oxide film.

7. The method of claim 1, wherein forming the mask pattern comprises:
    applying a photoresist on the semiconductor substrate; and
    patterning the photoresist while controlling a critical dimension thereof such that the portion of the target layer defined by the two adjacent second spacers is not exposed.

8. A method for forming patterns in a semiconductor memory device, the method comprising:
    forming a target layer on a semiconductor substrate;
    forming a first sacrificial layer pattern and a second sacrificial layer pattern on the target layer;
    forming first spacers on respective sidewalls of the first sacrificial layer pattern, and second spacers on respective sidewalls of the second sacrificial layer pattern;
    removing the first and second sacrificial layer patterns;
    forming a mask pattern covering a portion of the target layer defined by the adjacent second spacers;
    removing unnecessary spacers among the first and second spacers;

etching the target layers using the first spacers, the second spacers, and the mask pattern as an etch mask; and forming at least two first patterns and at least one second pattern by removing the first spacers, the second spacers, and the mask pattern, wherein the second pattern is wider than the first pattern.

9. The method of claim 8, wherein the target layer is a gate conductive layer of a transistor or a bit line conductive layer.

10. The method of claim 8, wherein the sacrificial layer pattern comprises an oxide.

11. The method of claim 8, wherein the first sacrificial layer pattern has a pitch as large as a double pitch of the first pattern.

12. The method of claim 8, wherein the second sacrificial layer pattern has a width smaller than a width of the second pattern by twice a thickness of the second spacer.

13. The method of claim 8, further comprising forming a hard mask of a single layer or multiple layers on the target layer, prior to forming the first and second sacrificial layer patterns.

14. The method of claim 8, further comprising forming an anti-reflection layer on the first and second sacrificial layer patterns.

15. The method of claim 8, wherein the first and second spacers comprise polysilicon or nitride.

16. The method of claim 8, wherein the first pattern is
a gate of a cell transistor and the second pattern is a gate of a select transistor in a flash memory device.

17. The method of claim 8, wherein the target layer comprises a polysilicon film or a stacked structure of a polysilicon film and a metal silicide film.

* * * * *